United States Patent
Davis et al.

(10) Patent No.: US 9,278,315 B2
(45) Date of Patent: Mar. 8, 2016

(54) PHOTOVOLTAIC-THERMAL (PV-T) SYSTEM FOR DESALINATION

(75) Inventors: Thomas A. Davis, El Paso, TX (US); Malynda A. Cappelle, El Paso, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 334 days.

(21) Appl. No.: 13/270,815

(22) Filed: Oct. 11, 2011

(65) Prior Publication Data

US 2012/0085094 A1 Apr. 12, 2012

Related U.S. Application Data

(60) Provisional application No. 61/391,965, filed on Oct. 11, 2010.

(51) Int. Cl.
*B60K 16/00* (2006.01)
*H01L 35/30* (2006.01)
(Continued)

(52) U.S. Cl.
CPC ............ *B01D 61/025* (2013.01); *B01D 1/0035* (2013.01); *B01D 61/027* (2013.01); *B01D 61/364* (2013.01); *B01D 61/422* (2013.01); *B01D 61/44* (2013.01); *C02F 1/14* (2013.01); *H01L 31/0521* (2013.01); *H01L 35/30* (2013.01); *B01D 2313/36* (2013.01); *B01D 2313/365* (2013.01); *C02F 1/02* (2013.01); *C02F 1/44* (2013.01); *C02F 1/441* (2013.01); *C02F 1/442* (2013.01); *C02F 1/447* (2013.01);
(Continued)

(58) Field of Classification Search
CPC .... B01D 61/025; B01D 61/44; B01D 61/027; B01D 61/422; B01D 1/0035; B01D 61/364; B01D 2313/36; B01D 2313/365; H01L 31/0521; H01L 35/30; C02F 1/14; C02F 1/4693; C02F 1/447; C02F 1/4695; C02F 2103/08; C02F 1/02; C02F 1/4691; C02F 1/442; C02F 1/441; C02F 2303/10; C02F 9/00; C02F 1/44; Y02W 10/30; Y02E 10/46; Y02E 10/52
USPC ............. 60/641.8–641.15; 136/205, 206, 246
See application file for complete search history.

(56) References Cited

U.S. PATENT DOCUMENTS 3,283,813 A * 11/1966 Kern et al. ..................... 166/271
3,995,429 A * 12/1976 Peters .......................... 60/641.8
(Continued)

OTHER PUBLICATIONS

Aiche, "Combining Light and Heat for More-Efficient Power Production," American Institute of Chemical Engineers, www3.aiche.org/cep, (2010), 1 page.
(Continued)

*Primary Examiner* — Hoang Nguyen
(74) *Attorney, Agent, or Firm* — Kevin Soules; Kermit D. Lopez; Luis M. Ortiz

(57) ABSTRACT

A photovoltaic-thermal (PV-T) system and a method of cooling photovoltaic (PV) cells in the system is described herein. Energy from an excitation source such as the sun hits the PV cells in the PV-T system causing heating that reduces PV efficiency. The PV cells are cooled by fluid in an intact heat-transfer system making a heated water byproduct while the PV cells release a form of energy. In addition, the PV-T system can be implemented in a desalination plant to harvest energy and heat for desalination processes. The present invention also includes methods for transferring heat from PV cells to the earth to improve PV performance and reduce thermal shock to the PV cells.

20 Claims, 2 Drawing Sheets

(51) Int. Cl.
*B01D 61/02* (2006.01)
*B01D 1/00* (2006.01)
*B01D 61/36* (2006.01)
*B01D 61/42* (2006.01)
*B01D 61/44* (2006.01)
*C02F 1/14* (2006.01)
*H01L 31/052* (2014.01)
*C02F 1/02* (2006.01)
*C02F 1/44* (2006.01)
*C02F 1/469* (2006.01)
*C02F 9/00* (2006.01)
*C02F 103/08* (2006.01)

(52) U.S. Cl.
CPC ............ *C02F1/4691* (2013.01); *C02F 1/4693* (2013.01); *C02F 1/4695* (2013.01); *C02F 9/00* (2013.01); *C02F 2103/08* (2013.01); *C02F 2303/10* (2013.01); *Y02E 10/46* (2013.01); *Y02E 10/52* (2013.01); *Y02W 10/30* (2015.05)

(56) References Cited

U.S. PATENT DOCUMENTS

| | | | | |
|---|---|---|---|---|
| 4,210,121 | A | * | 7/1980 | Stark .............................. 126/573 |
| 4,235,221 | A | * | 11/1980 | Murphy ........................ 126/567 |
| 7,582,826 | B2 | | 9/2009 | Miller et al. |
| 8,561,407 | B2 | * | 10/2013 | Sines ............................ 60/641.8 |
| 2003/0026536 | A1 | * | 2/2003 | Ho .................................. 385/33 |
| 2004/0084905 | A1 | * | 5/2004 | Strand ............................... 290/2 |
| 2007/0151244 | A1 | * | 7/2007 | Gurin ............................ 60/641.8 |
| 2008/0164135 | A1 | * | 7/2008 | Slook .............................. 202/83 |
| 2008/0250788 | A1 | * | 10/2008 | Nuel et al. ................... 60/641.14 |
| 2009/0158736 | A1 | * | 6/2009 | Mierisch ...................... 60/641.8 |
| 2010/0139771 | A1 | * | 6/2010 | Schwede et al. .............. 136/261 |
| 2010/0294266 | A1 | * | 11/2010 | Fung .............................. 126/688 |
| 2011/0011802 | A1 | * | 1/2011 | Maydan ........................ 210/652 |
| 2011/0308576 | A1 | * | 12/2011 | Chatterjee et al. ............. 136/248 |
| 2012/0055857 | A1 | * | 3/2012 | Marin et al. .................... 210/97 |

OTHER PUBLICATIONS

Cuddalorepatta, G., et al., "Durability of Pb-Free Solder Between Copper Interconnect and Silicon in Photovoltaic Cells," Progress in Photovoltaics: Research and Application, May 2010, vol. 18, Issue 3, pp. 168-182.

Hollick, Victoria, "The Next Solar Frontier: Hybrid PV/Thermal Systems," Conserval Engineering, Dec. 7, 2009, 5 pages.

Quintana, M.A., et al., "Diagnostic Analysis of Silicon Photovoltaic Modules After 20-Year Field Exposure," IEEE Photovoltaic Specialists Conference; Anchorage Alaska, Sep. 15-22, 2000, 4 pages.

Volther Hybrid Collectors, http://www.solimpeks.com/File/hybridcollectors.pdf, 2 pages.

* cited by examiner

PHOTOVOLTAIC-THERMAL (PV-T) SYSTEM FOR DESALINATION

CROSS-REFERENCE TO RELATED APPLICATIONS

This application is a non-provisional application of U.S. Provisional Patent Application No. 61/391,965 filed on Oct. 11, 2010 and entitled "Photovoltaic-Thermal (PV-T) system for Desalination" the entire contents of which is incorporated herein by reference.

TECHNICAL FIELD OF THE INVENTION

The present invention relates in general to the field of solar powered energy production and specifically to photovoltaic systems that harvest energy and methods implementing an intact cooling coil to cool photovoltaic cells and release heat.

STATEMENT OF FEDERALLY FUNDED RESEARCH

None.

REFERENCE TO A SEQUENCE LISTING

None.

BACKGROUND OF THE INVENTION

Without limiting the scope of the invention, its background is described in connection with photovoltaic (PV) systems that convert sunlight into electrical energy. The electrical energy, in turn, drives other processes. PV systems convert solar energy, in the visible wavelength portion of the electromagnetic spectrum, into electrical energy. The energy in the infrared (IR) wavelength portion of the electromagnetic spectrum is typically not converted to electrical energy and instead is absorbed by the PV cells, causing an increase in the PV cells' temperature. The electrical power production from a PV cell decreases substantially as its temperature increases. [1]Energy from the infrared wave length portion can be collected in solar thermal (ST) devices, but those devices are typically configured differently from PV systems.

U.S. Pat. No. 7,582,826 issued to Miller and Mach (2009) relates generally to the field of solar energy conversion, particularly to devices for converting solar photons into an electric current such as a compact photovoltaic generation assembly exhibiting improved photovoltaic efficiency and an extended operating life as compared to conventional photovoltaic systems.

SUMMARY OF THE INVENTION

The present invention discloses a photovoltaic-thermal (PV-T) system and a method of cooling photovoltaic (PV) cells by fluid in an intact cooling coil resulting in a heated water byproduct and release of a form of energy from the PV cells. The PV-T system of the present invention has widespread applications, including implementation in a desalination plant to harvest energy and heat for desalination processes.

In one embodiment the present invention discloses a photovoltaic-thermal (PV-T) based desalination system, wherein the PV-T system comprises: one or more arrays of photovoltaic (PV) cells in thermal communication with an excitation source, a cooling system in contact with the PV-T system, wherein a fluid that traverses the cooling system cools the PV cells and makes a heated water byproduct, and a desalination system for capturing and using a thermal energy from the heated water byproduct. In one aspect of the present invention one or more lenses or mirrors are used to intensify the thermal communication with the excitation source to harvest a form of energy. In another aspect, the desalination system comprises a reverse osmosis (RO), nanofiltration (NF), electrodialysis (ED), electrodialysis reversal (EDR), electrodeionization (EDI), capacitive deionization (CDI), membrane distillation (MD), evaporative desalination processes or any combinations thereof.

In another embodiment the present invention describes a method of cooling one or more photovoltaic (PV) cells in a photovoltaic-thermal (PV-T) based desalination system, comprising the steps of: disposing a cooling system on, at, or about the one or more PV cells, wherein a fluid that traverses the cooling system cools the PV cells to produce a heated water byproduct, capturing the heated water byproduct from the fluid and a form of energy from the PV cells, and using the captured heated water byproduct to heat water in the desalination system, wherein the desalination system comprises a reverse osmosis (RO), nanofiltration (NF), electrodialysis (ED), electrodialysis reversal (EDR), electrodeionization (EDI), capacitive deionization (CDI), membrane distillation (MD), evaporative desalination processes, or any combinations thereof. In one aspect the form of energy from the PV cells is electrical energy, wherein the electrical energy is used to drive one or more energy loads in the desalination system.

In yet another embodiment the instant invention discloses a photovoltaic-thermal (PV-T) system in a desalination plant, wherein the PV-T system comprises: (i) one or more arrays of photovoltaic (PV) cells in thermal communication with an excitation source and (ii) a cooling system in contact with the PV-T system, wherein a fluid that traverses the cooling system cools the photovoltaic cells and makes heated water byproduct in a desalination plant. In one aspect of the PV-T system described hereinabove one or more lenses or mirrors are used to intensify the thermal communication with the excitation source to harvest a form of energy.

In one embodiment the instant invention relates to a method of cooling one or more photovoltaic (PV) cells in a photovoltaic-thermal (PV-T) system in a desalination plant comprising the steps of: disposing a cooling system on, at, or about the one or more PV cells, wherein a fluid that traverses the cooling system cools the PV cells to produce a heated water byproduct and releasing the energy from the heated byproduct into a heat sink.

In one aspect the energy is used to heat water before it enters the desalination process (for e.g. reverse osmosis (RO)). In another aspect the energy is used to heat a concentrate solution pumped to a disposal well to reduce water viscosity and pumping power. In another aspect the energy evaporates water from the concentrate solution. In yet another aspect the energy is used by the one or more energy loads and any process stream in a desalination plant. In another aspect the fluid is used as a heat sink and an intermediate heat exchanger circulates through the PV cells and underground pipes. In a specific aspect the heat sink is earth.

In one aspect of the method described hereinabove the fluid contacting the PV cells is circulated directly through underground pipes and the fluid contacting the PV cells is circulated through the intermediate heat exchanger and groundwater flows across an opposite side of a heat exchange surface. In another aspect the heated water byproduct is fed to a desalination device. In yet another aspect the instant invention describes one or more photovoltaic (PV) cells cooled by the method described above.

Another embodiment of the instant invention provides a method of converting solar energy to electrical energy with an energy conversion device and a heat sink, wherein the heat sink is groundwater. In one aspect the energy conversion device uses a thermoelectric effect, wherein a junction of the device receives thermal energy from a solar collector and a cold junction of the device releases thermal energy to groundwater. In another aspect the energy conversion device uses a steam cycle, a turbine, and a generator, wherein the steam cycle is generated by heat from the solar collector and the groundwater is used to condense the steam after passing through the turbine. In a specific aspect the energy conversion device is a photon enhanced thermionic emission (PETE) device. In yet another aspect the energy conversion device is used in a desalination process such as reverse osmosis (RO), nanofiltration (NF), electrodialysis (ED), electrodialysis reversal (EDR), electrodeionization (EDI), capacitive deionization (CDI), membrane distillation (MD), evaporative desalination processes, or any combinations thereof.

In yet another embodiment the instant invention discloses a method for desalination of water or a fluid comprising the steps of: (i) providing a photovoltaic-thermal (PV-T) based desalination system, wherein the PV-T desalination system comprises: one or more arrays of photovoltaic (PV) cells in thermal communication with an excitation source, a cooling system in contact with the PV-T system, wherein a fluid that traverses the cooling system cools the PV cells and makes a heated water byproduct a form of electrical energy, a capture system for capture and use of the heated water byproduct from the fluid and the form of electrical energy from the PV cells; and a desalination apparatus or process for desalinating the water or the fluid; (ii) providing a process stream, wherein the process stream comprises the water or the fluid to be desalinated; (iii) heating the water or the fluid using thermal energy from the heated water byproduct before it is pumped or introduced into the desalination system; and (iv) desalinating the water or the fluid using one or a combination of processes selected from the group consisting of reverse osmosis (RO), nanofiltration (NF), electrodialysis (ED), electrodialysis reversal (EDR), electrodeionization (EDI), capacitive deionization (CDI), membrane distillation (MD), evaporative desalination processes, or any combinations or modifications thereof.

In one aspect of the method hereinabove the thermal energy is used to heat water before it enters the desalination process. In another aspect the thermal energy is used to heat a concentrate solution pumped to a disposal well to reduce water viscosity and pumping power. In yet another aspect the thermal energy evaporates water from the concentrate solution. In a specific aspect the electrical energy is used by the one or more energy loads and any process stream in a desalination plant.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
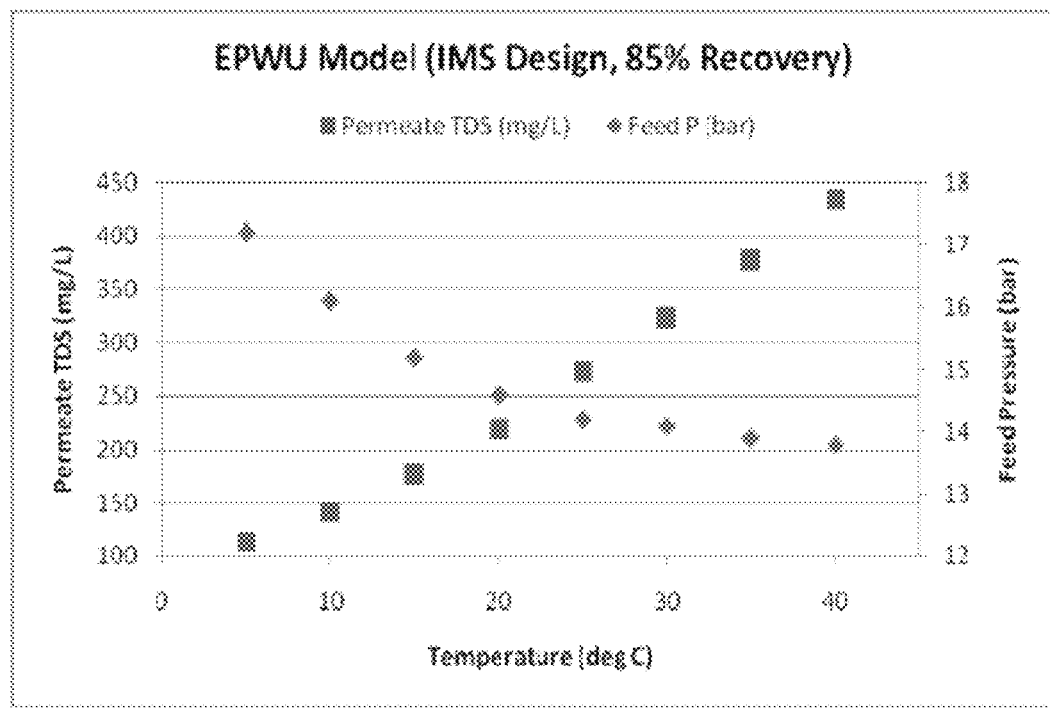
FIG. 1 is a graph showing the temperature effects projected for the water and reverse osmosis (RO) membranes at a desalination plant.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

As used herein "photovoltaic", abbreviated as "PV", refers to the direct conversion of light energy into electricity. As used herein the term "photovoltaic cell" refers to the smallest semiconductor unit within a photovoltaic element. The term "solar cell" is also used to refer to a photovoltaic cell.

As used herein, the term "AC current" refers to an alternating electrical current that flows in one direction, reverses and flows in the opposite direction. As used herein, the term "DC current" refers to a direct electrical current that flows in one direction only. As used herein, the term "inverter" refers to an electrical device that converts DC current to AC current.

The photovoltaic-thermal (PV-T) system of the present invention cools photovoltaic (PV) cells, making a heated water byproduct. In addition the PV-T system is used in a desalination plant, increasing the use of sunlight as an energy source for desalination. This invention covers not only the use of water-cooled PV cells but more generally the recovery of thermal energy from the same land area that is covered by the PV cells. The concept is described herein as the use of PV energy to drive the pumps that supply high-pressure water to reverse osmosis (RO) devices and the use of the thermal energy to heat the groundwater before it enters the RO.

The PV power can be used by any electrical load in a desalination plant, and the collected thermal energy can be used anywhere it is beneficial in a desalination plant. Thermal energy used to raise the feed water temperature reduces the energy required to drive a variety of desalination processes including RO, nanofiltration (NF), electrodialysis (ED), electrodialysis reversal (EDR), electrodeionization (EDI), capacitive deionization (CDI), membrane distillation (MD), and evaporative desalination processes. Thus, this invention includes the use of thermal energy from PV-T systems to warm any process stream in a desalination process. The invention covers not only flat-plate PV arrays like those used by Solimpeks Corp., but also PV systems that use lenses, mirrors or other reflective surfaces to intensify the solar energy on the PV cells.

The examples below illustrate the use of thermal energy from the PV-T system in the desalination plant operated by El Paso Water Utilities (EPWU). The three examples are: (i) heating the groundwater before it enters the RO modules, (ii) heating the concentrate that must be pumped to a disposal well to reduce the viscosity of the water and thus reducing the pumping power required, and (iii) providing heat for evaporating water in a system to remove water from the concentrate.

Thermal energy is released from cooling of the PV cells, solar energy reflected by the surface of the PV cells, and solar energy that passes through or between the PV cells in the array.

Heating the feed water before allowing it to pass through a RO desalination device reduces the amount of energy required to achieve desalination. Osmotic pressure increases in proportion to the absolute temperature of the solution, but the viscosity of the solution decreases so much that the viscosity effects overwhelm the effect of temperature rise on osmotic pressure. The net effect is that the pressure required for RO decreases as temperature of the feed solution increases.

FIG. 1 shows that heating the water would reduce the required pressure by about 1% for each 1° C. rise in temperature in the vicinity of 25° C.

Temperatures of PV systems can reach up to 80° C. if no cooling is supplied.[2] Considerable efficiencies are achieved by cooling a PV cell. For example, a PV cell had electrical output of 108 W/m$^2$ at 60° C. and 138 W/m$^2$ at 20° C., a 27.8% improvement, and thermal electrical output of 475 W/m$^2$ at 60° C. and 680 W/m$^2$ at 20° C.[1] Groundwater is supplied to the EPWU desalination plant at about 25° C. Calculations interpreting these figures show that, for a RO system with feed water and membranes characteristic of the EPWU plant, the heat removed from a PV system powering the RO pump would raise the feed water temperature about 1.97° C. and that improvement in PV power output would be about 23% compared to operating the PV cell at 60° C. Thus there would be a major benefit in cooling the PV and a minor benefit is gained by heating the feed water for the RO. These benefits are available when the sun hits the PV cells and thus, the benefit is in direct correlation with sunlight intensity.

The heat removed from a PV system can also be used beneficially to heat the solutions being processed in an electrodialysis (ED) device. The electrical resistance of electrolyte solutions typically drops about 2% for every degree Celsius rise in the temperature of the solution. Since the power consumed by ED is proportional to the resistance of the membranes and solutions between the electrodes of the ED device, an increase in temperature of 1° C. reduces power consumption about 2%. Furthermore, an increase in the temperature of the process streams improves the solubility of most salts. For example, in the process described in U.S. Pat. No. 7,459,088 (relevant portions incorporated herein by reference) electrodialysis metathesis (EDM) is used to remove CaSO4 from RO concentrate and produce concentrated streams containing CaCl2 and Na2SO4 by changing partners with NaCl. Operating the EDM at higher temperature is beneficial, because the concentration of the Na$_2$SO$_4$ solution can be raised to a higher level due to increased solubility of Na2SO4. Linking of PV and ED is preferably implemented by circulating one of the ED process streams through a heat exchanger in which the heat transfer fluid from the PV panels also flows.

Heat removed from a PV system can be used beneficially in membrane distillation (MD). MD is a desalination process that utilizes a hydrophobic microporous membrane that is permeable to water vapor but blocks the transport of liquids. One way of operating MD is to have a warm salty solution flowing on one side of the membrane and cool water flowing across the other side of the membrane. Water vapor from the warm solution permeates the membrane pores and condenses in the cool water. MD is particularly applicable when the feed water is already warm. Warming the water with heat from the PV system reduces the cost of the cost of MD. In a preferred embodiment of the process, feed water to the MD is heated first in the heat exchanger with heat provided from the PV for maximum cooling of the PV, and then the water is heated further by heat from another source.

Since solar energy is not available constantly or consistently, an embodiment of this invention converts the direct current (DC) output of the PV cells into alternating current (AC) for input to the power system of the desalination plant. Inverters which are commercially available for grid-connected PV systems make the DC-AC conversion. Input of PV power into the plant system will allow full utilization of the PV power when it is available and uninterrupted operation of the plant when PV power is not available.

Figure 2:
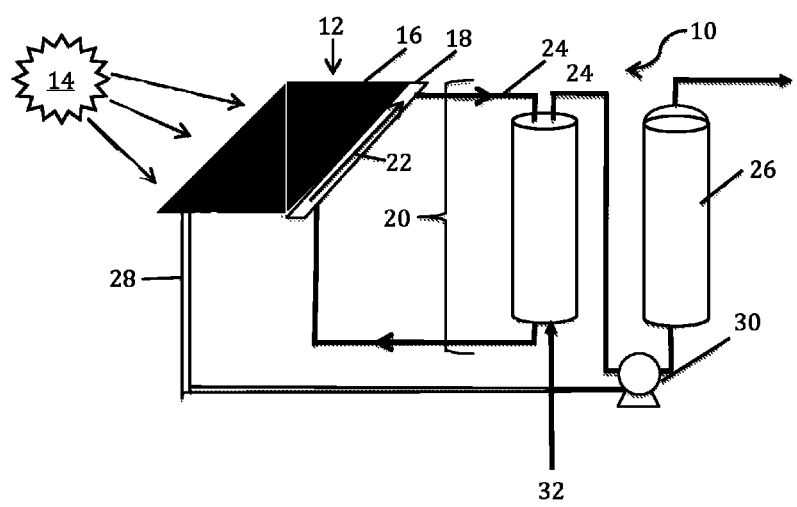
FIG. 2 shows a photovoltaic-thermal (PV-T) based desalination system of the present invention.

FIG. 2 shows a photovoltaic-thermal (PV-T) based desalination system 10 of the present invention. The PV-T desalination system 10 includes one or more arrays of photovoltaic-thermal PV-T cells 12 in thermal communication with an excitation source 14, wherein the PV-T cells 12 have a photovoltaic portion 16 and a thermal portion 18; a cooling system 20 in contact with the PV-T cells, wherein a fluid 22 that traverses the cooling system 20 cools the PV-T cells and makes a heated water byproduct 24; and a desalination system 26 connected to the PV-T cells, wherein the photovoltaic portion of the PV-T cells provides electrical energy 28 to drive water pumps 30 in the desalination system 26 and wherein the thermal portion of the PV-T cells 18 provides a heated water byproduct 24 that increases the temperature of the water 32 entering the desalination system 26 thereby using both the electrical and thermal energy from the excitation source 14.

Another embodiment of the invention uses an intermediate heat exchanger so that a heat transfer fluid carries the heat from the PV cells to the intermediate heat exchanger. Water containing antifreeze constitutes heat transfer fluid circulating through the PV panels and eliminates the possibility of freezing the system, particularly on cold nights when no fluid would be required in the PV cells. Alternatively, the antifreeze is used to arrange the PV-T system so that the heat transfer fluid drains from the PV cells and is stored in a tank that is not exposed to freezing temperatures. The intermediate heat exchanger also provides flexibility to operate the cooling system at flow rates that are different from those required for the desalination system. The intermediate heat exchanger can use a heat transfer fluid free of solutes. The solutes could foul heat transfer surfaces due to the inaccessibility for cleaning of the heat transfer surface in the PV cell.

In addition to the improved power output efficiency, cooling the PV cell also improves durability of the PV cell by reducing thermal stress. The importance of thermal stress is exemplified by this quotation related to electrical connections within PV cells: "Owing to the large mismatches in the thermal expansions of the Si cell and the copper strip, mechanical stresses arise in the PV cell under operating conditions. Under the influence of these thermo-mechanical stresses and service conditions, each layer of the cell degrades, which in turn decreases the power generated by the PV cell.[3]" A 2.5%/yr degradation rate on the array level is attributed to thermo-mechanical stresses that result from temperature changes.[4] Circulation of heat exchange fluid through PV cells proposed for EPWU has the potential for minimizing the temperature extremes that cause thermal stresses. Circulating the fluid at night when the ambient temperature is low will prevent the thermal shock of low temperatures (heating mode); circulating the fluid during the day will prevent the thermal shock of high temperatures (cooling mode). It is likely that the circulation rate can be reduced when the system is in the heating mode of operation. A preferred mode of operation of this invention is to maintain uninterrupted circulation of the groundwater and the heat transfer fluid through the heat exchanger of the PV-T system.

When there is a use for the heat recovered from the PV cells such as the application for desalination mentioned earlier, there is an added incentive to recover the heat. But there is still a strong incentive to control the temperature to nearly constant even when there is no use for the recovered heat. Particularly in high desert regions where insolation levels are high and nighttime temperatures drop dramatically due to low humidity and high radiation into space. Exposure to extreme temperature fluctuations places stress in the PV cell at junctions between materials with different coefficients of thermal expansion. Circulation of a heat transfer fluid of nearly constant temperature will reduce thermal stress in PV cells as well as increase their electrical efficiency.

This invention also includes groundwater-source heat transfer. Groundwater is pumped out of one well, used as a heat sink for PV-T and returned to the ground. Water can be returned to the original well or elsewhere. The use of groundwater as the heat sink would require the use of an intermediate heat exchanger. The heat transfer fluid (typically an aqueous antifreeze solution) circulates through the PV array and through the pipes buried in the ground.

This invention also includes the use of the earth as a heat sink for PV cells. When a flowing heat sink, such as groundwater for desalination, is not available, a large heat sink is needed. The large earth heat sink is commonly used in ground-source heat pumps in which a heat-transfer fluid from the heat pump is circulated through pipes buried in the ground. One limitation with ground-source heat pumps is that the zone near the buried pipes gradually heats up over the summer when heat is being transferred to the ground and gradually cools down over the winter when heat is being removed from the ground. This limitation is not so important when the ground is being used for controlling temperature in PV cells, because the cycle of heating and cooling of the soil is only 24 hours for PV compared to a cycle of 365 days for the heat pump. A major benefit to the use of buried pipes for the ground-source PV is that an intermediate heat exchanger is not required. Elimination of the heat exchanger lowers the cost of the system and removes the temperature difference associated with the intermediate heat exchanger.

This invention also includes all methods of solar energy collection wherein thermal energy is beneficially removed from the solar energy collector for the purpose of making the solar energy collection system more efficient. Several heat sink options are included in this invention.

An example of the beneficial use of the invention is in the conversion of solar power to electrical energy wherein the thermoelectric effect (TE) is used. TE is used in the sensing of temperature with a thermocouple (TC). In the TC application two dissimilar metals are brought together in physical and electrical contact to form what is called a junction. The contact can be made by clamping, welding soldering, fusion or any other means known in the art of thermocouples. TE is most simply demonstrated with junctions at both ends of a pair of wires of dissimilar metals. When the two junctions are exposed to different temperatures, an electric current flows through the loop formed by the two wires. If one of the wires is cut and the ends are connected to a high-impedance voltmeter, the measured voltage is proportional to the difference between the temperatures of the cold and hot junctions. For example, if the two wires are copper and constantan, the voltage is 41 µV/° C.

In this invention the thermoelectric effect (TE) is applied to the desalination of water using solar energy to raise the temperature of the hot junction and using the water to be desalted to cool the cold junction. The hot junction can be imbedded in another solar collection device, such as a PV cell or it can be the primary receptor of the solar energy. If the hot junction is the primary receptor, the hot junction is preferably at the focal point of a device that reflects or magnifies the solar energy in order to attain a high temperature for the hot junction and thus produce a high energy output from the TE device. This invention also includes using the earth or groundwater as a heat sink for solar energy collection devices based on the thermoelectric effect.

This invention also includes using groundwater or the earth as a heat sink for solar thermal devices that produce electricity. An example of such a device is a device that uses mirrors to reflect sunlight onto a thermal collector. A fluid, for example water, is boiled in the thermal collector to produce a high-pressure vapor (steam) that flows through a turbine that is mechanically coupled to a generator to produce electrical energy. The vapor is cooled, condensed to the liquid state, and returned to the thermal collector. This thermal cycle requires a heat sink to remove heat from the condenser. In this invention the heat dissipated in the condenser is used to warm the groundwater feeding the desalination device to reduce the energy required for desalination.

This invention also includes using groundwater or the earth as a heat sink for devices that combine PV solar thermal effects to produce electricity. An example of such a device is photon enhanced thermionic emission (PETE) described in "Combining Light and Heat for More-Efficient Power Production."[5] The PETE device uses a semiconductor that reaches its maximum efficiency for conversion of solar energy to electrical energy at a much higher temperature than the typical silicon PV cells. Solar concentrators are used to achieve these higher temperatures. An application of this invention uses solar thermal devices that produce electricity as described above as well as the electrical energy produced in PETE devices to provide power for a desalination plant and thermal energy to warm the feed water and reduce power consumption in the desalination device.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

U.S. Pat. No. 7,582,826: Compact Photovoltaic Generation Assembly and Power Supply.
1. www.solimpeks.com/File/hybridcollectors.pdf
2. www.renewableenergyworld.com/rea/news/article/2009/12/thenext-solar-frontier-producing-more-energy-with-hybrid-pvthermal-systems
3. onlinelibrary.wiley.com/doi/10.1002/pip.944/pdf
4. photovoltaics.sandia.gov/docs/PDF/quinking.pdf
5. www.aiche.org/uploadFiles/CEP/Issues/2010-09/091008.pdf

What is claimed is:

1. A photovoltaic-thermal (PV-T) based desalination system, the PV-T based desalination system comprising:
at least one array of PV-T cells in thermal communication with solar irradiation, wherein the array PV-T cells comprise a photovoltaic portion configured to collected electrical energy from the sun and a thermal portion configured to collect thermal energy from the sun;
a cooling system in contact with the array of PV-T cells, wherein a fluid traversing the cooling system beneficially cools the array of PV-T cells and produces a heated water byproduct; and
a desalination system connected to the array of PV-T cells, wherein the heated water byproduct increases the temperature of saltwater entering the desalination process thereby reducing the viscosity of the saltwater with a consequent reduction in the pumping power required to desalt the saltwater, and wherein the photovoltaic portion of the array of PV-T cells provides electrical energy to drive a plurality of water pumps that pressurize water for a pressure-driven desalination process thereby utilizing both the electrical and thermal energy provided by the sun.

2. The PV-T based desalination system of claim 1 wherein the pressure-driven desalination process comprises one of reverse osmosis (RO), nanofiltration (NF), or any combination thereof.

3. The PV-T based desalination system of claim 1 further comprising at least one of, one or more lenses and one or more mirrors configured to intensify the energy from the sun at the array of PV-T cells.

4. The PV-T based desalination system of claim 1 further comprising a heat sink wherein energy in the heated water byproduct is released into the heatsink.

5. The PV-T based desalination system of claim 4 further comprising an intermediate heat exchanger and a second fluid, wherein the heated water byproduct circulates through the intermediate heat exchange and the second fluid circulates through the heat exchanger and through the heat sink before return to the array of PV-T cells.

6. The PV-T based desalination system of claim 5 wherein the heat sink is earth.

7. The PV-T based desalination system of claim 5 wherein the heat sink is groundwater in ground below the desalination system.

8. The PV-T based desalination system of claim 5 wherein the heated water byproduct is circulated through the intermediate heat exchanger and groundwater flows across an opposite side of the intermediate heat exchanger surface.

9. A photovoltaic-thermal (PV-T) based desalination system, the PV-T based desalination system comprising:
at least one array of PV-T cells in communication with solar irradiation, the PV-T cells comprising a means of collecting electrical energy and a means of collecting thermal energy from the sun;
a cooling system in contact with the array of PV-T cells, wherein a fluid traversing the cooling system beneficially cools the array of PV-T cells and produces a heated water byproduct; and
a desalination system connected to the PV-T cells, wherein the heated water byproduct increases the electrical conductivity of saltwater entering the desalination process reducing the electrical power required to desalt the saltwater, and the means for collecting electrical energy provides electrical energy to an electrodialysis desalination process, thereby utilizing both the electrical and thermal energy provided by the sun.

10. The PV-T based desalination system of claim 9 wherein the electrodialysis desalination process comprises at least one of:
electrodialysis (ED);
electrodialysis reversal (EDR);
electrodialysis metathesis (EDM);
electrodionization (EDI);
capacitive deionization (CDI); and
any combination thereof.

11. The PV-T based desalination system of claim 9 further comprising at least one of, one or more lenses and one or more mirrors configured to intensify the energy from the sun at the array of PV-T cells.

12. The PV-T based desalination system of claim 9 further comprising a heat sink wherein energy in the heated water byproduct is released into the heats ink.

13. The PV-T based desalination system of claim 12 further comprising an intermediate heat exchanger and a second fluid, wherein the heated water byproduct circulates through the intermediate heat exchange and the second fluid circulates through the heat exchanger and through the heat sink before return to the array of PV-T cells.

14. The PV-T based desalination system of claim 13 wherein the heat sink is earth.

15. The PV-T based desalination system of claim 13 wherein the heat sink is groundwater in ground below the desalination system.

16. The PV-T based desalination system of claim 13 wherein the heated water byproduct is circulated through the intermediate heat exchanger and groundwater flows across an opposite side of the intermediate heat exchanger surface.

17. A photovoltaic-thermal(PV-T) based desalination system, the PV-T based desalination system comprising:
- at least one array of PV-T cells in thermal communication with solar irradiation, wherein the array PV-T cells comprise a photovoltaic portion configured to collected electrical energy from the sun and a thermal portion configured to collect thermal energy from the sun;
- a cooling system in contact with the array of PV-T cells, wherein a fluid traversing the cooling system beneficially cools the PV-T cells and produces a heated water byproduct; and
- a desalination system connected to the array of PV-T cells, wherein the heated water byproduct increases the temperature of saltwater entering the desalination process thereby reducing the thermal power required to desalt the saltwater and the photovoltaic portion of the array of PV-T cells provides electrical energy to drive pumps and auxiliary equipment for a thermally driven desalination process, thereby utilizing both the electrical energy and thermal energy provided by the sun.

18. The PV-T based desalination system of claim 17 wherein the thermally driven desalination process comprises one of:
- membrane distillation (MD),
- multi-stage flash evaporation (MSF), and
- multi-effect distillation (MED).

19. The PV-T based desalination system of claim 17 further comprising at least one of, one or more lenses and one or more mirrors configured to intensify the energy from the sun at the array of PV-T cells.

20. The PV-T based desalination system of claim 17 further comprising:
- a heat sink comprising groundwater in ground below the desalination system wherein energy in the heated water byproduct is released into the heatsink; and
- an intermediate heat exchanger and a second fluid, wherein the heated water byproduct circulates through the intermediate heat exchange and the second fluid circulates through the heat exchanger and through the heat sink before return to the array of PV-T cells.

* * * * *